United States Patent
Park et al.

[11] Patent Number: 5,801,315
[45] Date of Patent: Sep. 1, 1998

[54] DEVELOPER FLOW CHECK SYSTEM AND METHOD THEREOF

[75] Inventors: Geun-bok Park; Kil-yong Kim; Jae-seung Go; Dong-heyun Kim, all of Suwon, Rep. of Korea

[73] Assignee: Samsung Electronics Co., Ltd., Suwon, Rep. of Korea

[21] Appl. No.: 755,155

[22] Filed: Nov. 22, 1996

[30] Foreign Application Priority Data

Nov. 23, 1995 [KR] Rep. of Korea ............ 1995 43199

[51] Int. Cl.$^6$ .................................. G01F 1/22
[52] U.S. Cl. ............... 73/861.57; 73/861; 222/67; 118/712
[58] Field of Search .......... 73/861.55, 861.56, 73/861.57, 861; 118/688, 690, 691, 693, 694, 708, 711–714; 427/8; 222/62, 64, 67, 71

[56] References Cited

U.S. PATENT DOCUMENTS

| | | | |
|---|---|---|---|
| 3,194,434 | 7/1965 | Evanson | 222/67 X |
| 3,207,372 | 9/1965 | Evans | 222/67 X |
| 3,229,854 | 1/1966 | Trunquist | 222/67 |
| 3,401,834 | 9/1968 | Siegla | 222/62 |
| 4,277,832 | 7/1981 | Wong | 73/861.42 X |
| 4,667,852 | 5/1987 | Siemann | 222/63 X |
| 4,716,768 | 1/1988 | David et al. | 73/861 |
| 4,783,343 | 11/1988 | Sato | 427/8 |
| 4,840,138 | 6/1989 | Stirbis | 118/694 |
| 4,894,252 | 1/1990 | Bongen et al. | 118/712 X |
| 4,906,165 | 3/1990 | Fox et al. | 417/12 |
| 5,021,312 | 6/1991 | Yoda | 430/97 |
| 5,090,594 | 2/1992 | Randall, Jr. et al. | 222/64 X |
| 5,127,362 | 7/1992 | Iwatsu et al. | 118/667 |
| 5,288,325 | 2/1994 | Gomi | 118/712 X |
| 5,373,746 | 12/1994 | Bloss | 73/861.55 |
| 5,402,686 | 4/1995 | Wittmann | 73/861.55 |
| 5,405,443 | 4/1995 | Akimoto et al. | 118/712 X |
| 5,510,149 | 4/1996 | Schucker | 427/8 X |
| 5,544,786 | 8/1996 | Gamilis et al. | 222/71 X |
| 5,645,642 | 7/1997 | Nishizato et al. | 118/712 X |
| 5,649,576 | 7/1997 | Kirk et al. | 221/71 X |

*Primary Examiner*—George Dombroske
*Assistant Examiner*—Paul D. Amrozowitz
*Attorney, Agent, or Firm*—Jones & Volentine, L.L.P.

[57] ABSTRACT

A developer flow check system is capable of directly determining the actual amount of developer from a nozzle. The system includes: a pressure regulator; a reservoir connected to the pressure regulator; a valve connected to the reservoir; a developer nozzle connected to the valve; and a post nozzle developer flow check section connected to the developer nozzle, for adjusting the quantity of the developer actually injected to an wafer to conform to a preset quantity is developer. The post nozzle developer flow check section includes: a developer flow check tube arranged for receiving the developer delivered from said developer nozzle. A sensor detects movement of said display a developer flow controller connected to said sensor determines a time interval which developer flows through the tube and the quantity of developer is calculated thereby. a developer flow check system controller receiving a control signal from the developer flow controller, to control the actual developer flow.

11 Claims, 1 Drawing Sheet

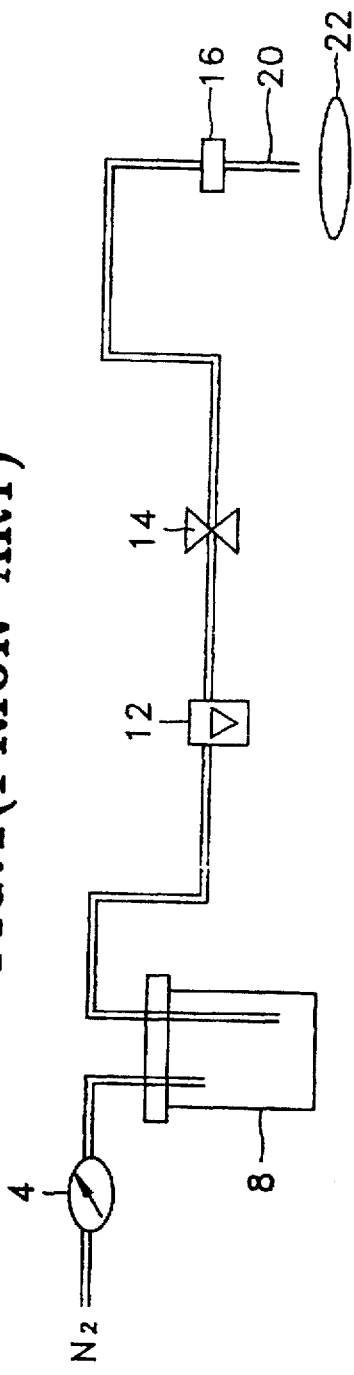
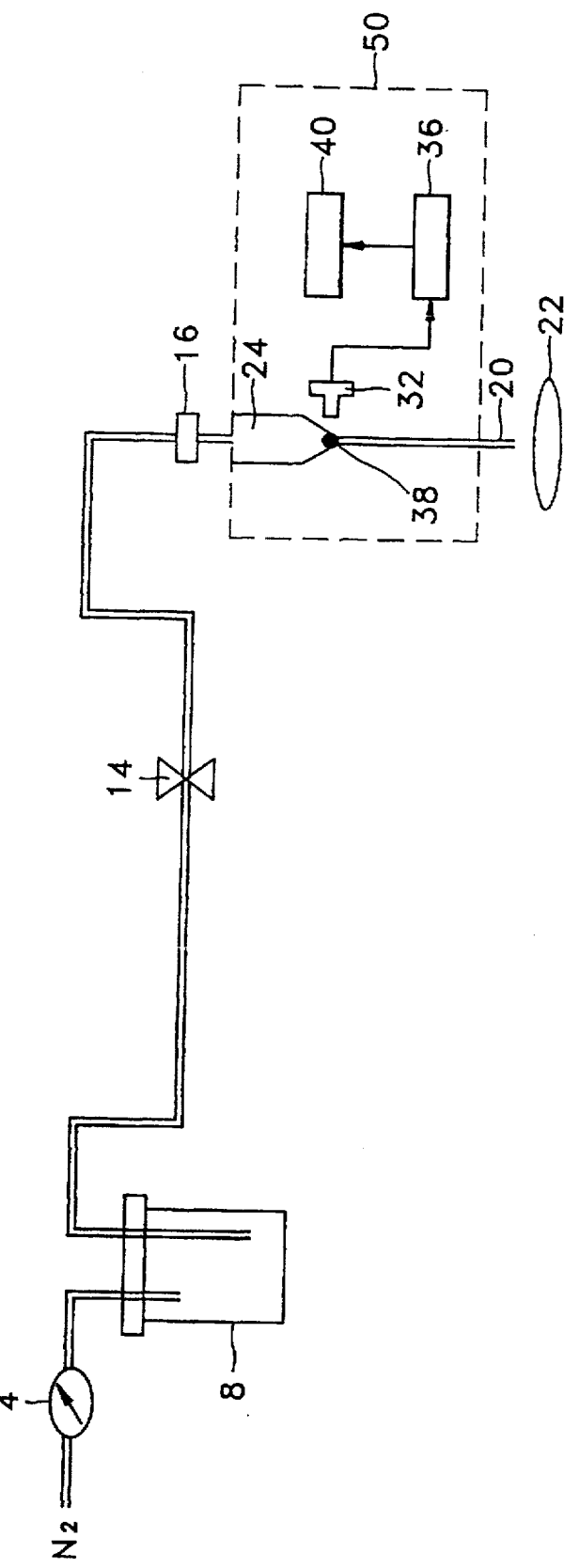

DEVELOPER FLOW CHECK SYSTEM AND METHOD THEREOF

TECHNICAL FIELD

The present invention generally relates to a developer flow check system and operating method thereof for use in photolithography processes. In particular, the present invention is directed to a developer flow check system capable of directly measuring the actual quantity of developer delivered from a nozzle to a wafer.

BACKGROUND OF THE INVENTION

Photolithography processes for forming a desired pattern on a wafer substrate generally include the steps of coating the wafer with photoresist and exposing a portion of the photoresist to light. Developer is inserted on the photoresist, removing the exposed portion of photoresist (in the case of positive resist) or the unexposed portion (in the case of negative resist), to thereby form a desired photoresist pattern. Such patterns are used to shape underlying layers such as an insulating material or a conductive material by using the photoresist pattern as a mask.

A desired pattern is obtainable only when a photoresist is first patterned as intended. For proper patterning, the photoresist should be uniformly coated, and the exposure of the photoresist to light should not be excessive or insufficient. Any photoresist reaction with ozone or oxidized nitrogen in the air should be suppressed, and the developer and cleaning rinse must be properly applied for an accurate pattern to be formed.

Depending on the type of resist used, if the quantity of developer is insufficient, the developing is not entirely successful so that a portion of the photoresist that should have been removed by the developing process, remains. This remaining portion of the photoresist, although thin, presents a substantial obstacle to patterning the underlying layer when using the photoresist pattern as the mask. Accordingly, it is difficult to obtain an accurate pattern in the underlying layer, such as insulating material or conductive material, required for the semiconductor device. On the other hand, if there is over-development of the photoresist, manufacturing costs are unnecessarily increased, and a portion of unexposed photoresist adjacent to the exposed photoresist may be deteriorated so that the line width between the photoresist patterns is hard to control rendering the formation of accurate patterns for semiconductor devices problematic.

FIG. 1 depicts a conventional developer flow check system, in which reference numeral 4 denotes a pressure regulator; reference numeral 8 denotes a reservoir; reference numeral 12 denotes a developer check meter; reference numeral 14 denotes a valve; reference numeral 16 denotes a nozzle; and reference numeral 20 denotes an outlet. All of these devices are serially connected, whereby pressure regulator 4 is connected to reservoir 8, and the developer of the reservoir 8 is fed into flow check meter 12 which is in turn connected to valve 14 and nozzle 16. Developer fluid to be ejected from nozzle 16 is supplied to the wafer 22 via outlet 20.

If $N_2$ at a given pressure is applied from the pressure regulator 4 to the reservoir 8, the developer of the reservoir 8 is delivered to the developer check meter 12 and thereafter to the valve 14. If valve 14 is open, the developer runs into the developer nozzle 16. When the developer is injected through the developer nozzle 16, the developer flow check meter 12 is operative to check the flow of developer. The indication of the flow is accomplished by reading the scale corresponding to the position of a ball arranged within the developer flow check meter 12. The developer injected is applied to the wafer 22 provided with the photoresist thereon.

Since the actual quantity of the developer supplied to the wafer 22 is indirectly measured by the developer flow check meter 12 when the valve 14 is open, the developer quantity computed with conventional developer flow check systems does not represent the actual quantity delivered to the wafer. Accordingly, when using a positive resist, if the actual quantity of the developer applied to the wafer 22 is less than that measured at the developer flow check meter 12, the removal of the photoresist is not sufficient to form the desired photoresist pattern. And, if more developer is delivered than prescribed, a portion of the unexposed photoresist can also be removed. Consequently, the desired patterns of photoresist and the underlying layer are very difficult to obtain.

SUMMARY OF THE INVENTION

One object of the present invention is to provide a developer flow check system capable of accurately measuring the actual quantity of the developer delivered to a wafer.

Another object of the present invention is to provide a developer control system capable of accurately controlling the amount of developer delivered to a wafer.

A further object of the present invention is to provide a system with immediate control of developer delivered to a wafer based upon feed back of the actual amount of developer being delivered to the wafer.

Yet another object of the present invention is to provide a system in which measured amounts of developer delivered to a wafer are automatically compared to the prescribed amount of developer required for optimum manufacturing performance.

In order to achieve these and other objects of the present invention, a modified developer flow check system is used including a pressure regulator, a reservoir connected to the pressure regulator, a valve connected to the reservoir and a developer nozzle connected to the valve. A developer flow check section is connected downstream from the developer nozzle.

In another embodiment a method of measuring an amount of developer delivered by a developer flow check system is used to carry out the objects of the present invention. The developer flow check system includes a pressure regulator, a reservoir connected to the pressure regulator, a valve connected to the reservoir, a developer nozzle connected to the valve and a developer flow check tube operatively connected to the developer nozzle. The method includes the steps of sensing the beginning of the developer movement through the developer flow check tube, sensing complete drainage of the developer from the developer flow check tube, and determining a quantity of developer actually delivered from the developer nozzle. The quantity of developer measured is compared to a preset value of developer quantity, and the flow of developer through the system is adjusted based upon this comparison.

In a further embodiment of the present invention a developer flow check system includes a pressure regulator, a reservoir connected to the pressure regulator, a valve connected to the reservoir, and a developer nozzle connected to the valve. Also included is an arrangement for timing the flow of developer through a predetermined part of the developer flow check system, and another arrangement for calculating the quantity of developer actually delivered based upon a time interval of developer flow through the predetermined part of the system.

Yet another embodiment of the present invention is facilitated by a method of measuring an amount of developer delivered by a developer flow check system having a pressure regulator, a reservoir connected to the pressure regulator, a valve connected to the reservoir and a developer nozzle connected to the valve. The system is operated by measuring a quantity of developer actually delivered through part of the developer flow check system located downstream of the nozzle. The measured quantity of developer is compared with a preset value and a control signal is generated based upon the comparison. Developer flow is adjusted responsive to the control signal.

BRIEF DESCRIPTION OF THE DRAWINGS

FIG. 1 is a block diagram depicting a conventional developer flow check system used in photolithography processes.

FIG. 2 is a block diagram depicting the developer flow check system of the present invention.

DETAILED DESCRIPTION OF THE INVENTION

Referring to FIG. 2, the developer flow check system according to the present invention is explained using the same reference numerals indicated in FIG. 1. Additionally, reference numeral 50 represents the post nozzle developer flow check section of the present invention. The difference between conventional developer flow check systems and the present developer flow check system lies in that a post nozzle developer flow check section 50 is used, in place of the developer flow check meter 12 of the conventional invention.

The post nozzle developer flow check section 50 includes a developer flow check tube 24, a sensor 32, a developer flow controller 36, and a developer flow check system controller 40. The developer flow check tube 24 is provided with a display indicating the entrance and exit of the developer. The display should have a lower specific gravity than that of the developer. In one embodiment of the present invention, a ball 38 serves as the fluid indicator in the display.

The present invention employs the following principle: if the sectional area of a drain tube, the sectional area of a container and the height of the developer contained in the container are constant, the time required to completely pump out the developer, through the orifice of the drain tube, is constant.

Like conventional systems, the developer runs from the reservoir 8 to the developer nozzle 16 when the valve 14 stands open (indicative of a logical "non" state). The developer injected from the developer nozzle 16 flows into the developer flow check tube 24. As the developer flow check tube 24 receives the developer, the ball 38 floats up. This movement of ball 38 is detected by the sensor 32, converting the previous logical "on" state of sensor 32 to a logical "off" state. As the developer in the developer flow check tube 24 flows to the developer outlet 20, the ball 38 returns down to its original position, and is detected by the sensor 32. Accordingly, the condition of the sensor 32 returns to a logical "on" state. The developer flow controller 36 connected to the sensor 32 calculates the interval between the starting point of the logical "on" state and the starting point of the logical "off" state at the sensor 32. By applying the aforementioned principle, the actual quantity of the developer supplied to the wafer through the developer outlet 20 is computed by using the subject time interval. The actual quantity computed by the developer flow controller 36 is compared with a predetermined quantity dictated by the requirements of the photolithography process. If these two quantities are not equal to each other, a warning signal is sent from the developer flow controller 36 to the developer flow check system controller 40. This controller operates valve 14 to either increase or decrease the flow of developer, depending on the type of warning signal received. Thereafter, the actual quantity of the developer supplied to the wafer can be automatically adjusted to conform to the preset quantity based upon the most recent measurements of developer actually delivered. Since the respective sectional areas of the outlet 20 and the developer flow check tube 24 are fixed, the quantity of the developer being supplied to the wafer can be determined by the variation of the time expended during the draining process.

Since the developer flow check system of the present invention is designed to directly measure the quantity of the developer injected to the wafer, the quantity of the developer is applied to the wafer exactly as preset according to the specific process condition. Consequently, an accurate photoresist pattern can easily be formed, and unnecessary increases in manufacturing costs of the semiconductor device are avoided.

Although a number of arrangements of this invention have been mentioned by way of example, it is not intended that the invention be limited thereto. For example, the same measuring system can be used for fluids other than developer fluid in the construction of semiconductor devices on wafers. Accordingly, the invention should be considered to include any and all configurations, modifications, variations, combinations, equivalent arrangements or expansions falling within the scope of the following claims.

What is claimed is:

1. A developer flow check system, comprising:
   a pressure regulator;
   a reservoir connected to said pressure regulator;
   a valve connected to said reservoir;
   a developer nozzle connected to said valve;
   means for timing developer flow through a predetermined part of said developer flow check system located downstream from said developer nozzle;
   means for calculating a quantity of developer actually delivered based upon a time period of developer flow between a beginning of developer movement through said predetermined part as indicated by a first position of a display in said predetermined part, and a complete drainage of developer from said predetermined part as indicated by a second position of said display.

2. A developer flow check system of claim 1, further comprising means for comparing said quantity of developer to a preset value and generating a control signal responsive thereto.

3. A developer flow check system of claim 2, further comprising means for controlling said valve responsive to said control signal.

4. A developer flow check system, comprising:
   a pressure regulator;
   a reservoir connected to said pressure regulator;
   a valve connected to said reservoir;
   a developer nozzle connected to said valve; and
   a post nozzle developer flow check section connected downstream from said developer nozzle, said post nozzle developer flow check section comprising:

a developer flow check tube arranged to receive developer injected from said developer nozzle and having a display arranged to indicate a liquid level of said developer therein, a sensor arranged for detecting movement of said display, a developer flow controller connected to said sensor, said controller having means for determining a time period between detected positions of said display, means for determining actual developer quantity delivered, and means for comparing a preset value with said quantity of developer actually delivered, and a developer flow check system controller having means for receiving a control signal from said developer flow controller, and means for adjusting a quantity of said developer actually delivered to conform to said preset value.

5. The developer flow check system according to claim 4, wherein said quantity delivered from said developer nozzle to a wafer is measured using said time period between detected positions of said display.

6. The developer flow check system according to claim 4, wherein said display has a moving portion constituted of a material having a lower specific gravity than that of said developer.

7. The developer flow check system according to claim 6, wherein said moving portion of said display is in the shape of a sphere.

8. A method of measuring an amount of developer delivered by a developer flow check system having a pressure regulator, a reservoir connected to said pressure regulator, a valve connected to said reservoir, a developer nozzle connected to said valve, and a developer flow check tube operatively connected to said developer nozzle, said method comprising the steps of:

(a) flowing said developer through said developer nozzle;

(b) providing a display in said developer flow check tube to indicate a liquid level of said developer therein;

(c) sensing a beginning of developer movement through said developer flow check tube after flowing through said developer nozzle by detecting a first position of said display;

(d) sensing complete drainage of said developer from said developer flow check tube by detecting a second position of said display;

(e) determining a quantity of developer actually delivered from said developer nozzle based on said first position and said second position of said display;

(f) comparing a preset value of developer quantity to said quantity of developer measured; and (g) adjusting an amount of developer actually delivered based upon a control signal indicative of a comparison between said quantity of developer measured and said preset value of developer quantity.

9. The measuring method according to claim 8, said step (f) further comprises the substep of generating a control signal indicative of said comparison between said preset value and said quantity of developer measured.

10. The measuring method of claim 8, said step (e) further comprises a step of computing a time interval between the beginning and completion of developer movement through said developer flow check tube based upon detection of said first and second positions of said display.

11. The measuring method according to claim 8, wherein step (g) is carried out automatically, by sending a control signal to the controller operating said valve.

* * * * *